US006769599B1

(12) United States Patent
Momeni et al.

(10) Patent No.: US 6,769,599 B1
(45) Date of Patent: Aug. 3, 2004

(54) METHOD AND DEVICE FOR PLACING AND REMELTING SHAPED PIECES CONSISTING OF SOLDER MATERIAL

(75) Inventors: Kaveh Momeni, Berlin (DE); Ghassem Azdasht, Berlin (DE)

(73) Assignee: PAC-Tech-Packaging Technologies GmbH, Nauen (DE)

( * ) Notice: Subject to any disclaimer, the term of this patent is extended or adjusted under 35 U.S.C. 154(b) by 0 days.

(21) Appl. No.: 09/763,785

(22) PCT Filed: Aug. 18, 1999

(86) PCT No.: PCT/DE99/02554
§ 371 (c)(1),
(2), (4) Date: Nov. 13, 2001

(87) PCT Pub. No.: WO00/11921
PCT Pub. Date: Mar. 2, 2001

(30) Foreign Application Priority Data

Aug. 25, 1998 (DE) .......................... 198 38 532

(51) Int. Cl.⁷ .................... B23K 1/005; B23K 26/03; B23K 3/06
(52) U.S. Cl. ................ 228/180.22; 228/245; 228/257; 228/35; 219/121.66; 219/129
(58) Field of Search ................ 228/245, 246, 228/41, 257, 180.22; 219/121.63–121.66, 129

(56) References Cited

U.S. PATENT DOCUMENTS

| 4,278,867 A | * | 7/1981 | Tan ..................... 219/121.64 |
| 4,871,110 A | * | 10/1989 | Fukasawa et al. ......... 228/245 |
| 5,601,229 A | | 2/1997 | Nakazato et al. |
| 5,655,704 A | * | 8/1997 | Sakemi et al. ............ 228/246 |
| 5,741,410 A | * | 4/1998 | Tsurushima ............. 228/44.7 |
| 5,977,512 A | * | 11/1999 | Azdasht et al. ......... 219/121.63 |
| 6,059,176 A | * | 5/2000 | Azdasht et al. ............ 228/254 |
| 6,109,509 A | * | 8/2000 | Sakai et al. ............... 228/246 |
| 6,119,927 A | * | 9/2000 | Ramos et al. ............. 228/254 |
| 6,253,992 B1 | * | 7/2001 | Fjelstad .................... 228/245 |
| 6,402,014 B1 | * | 6/2002 | Inoue et al. .............. 228/245 |
| 6,460,755 B1 | * | 10/2002 | Inoue et al. .............. 228/246 |

FOREIGN PATENT DOCUMENTS

| DE | 43 20 055 A1 | 12/1994 |
| DE | 195 11 392 A1 | 10/1995 |
| DE | 44 43 822 | 6/1996 |
| DE | 195 41 996 A1 | 5/1997 |
| DE | 19739481 A1 * | 10/1998 |
| DE | 197 39 481 A1 | 10/1998 |
| JP | 01243554 | 3/1988 |
| JP | WO 98/12738 | 3/1988 |
| JP | 01-243554 A * | 9/1989 |
| WO | WO 99/17593 | 4/1999 |

* cited by examiner

*Primary Examiner*—Kiley Stoner
*Assistant Examiner*—Kevin McHenry
(74) *Attorney, Agent, or Firm*—McGlew and Tuttle, P.C.

(57) ABSTRACT

A method and a device for placing a multitude of shaped parts of solder material (20) on a bond pad arrangement (29) of a substrate (23), said bond pad arrangement comprising a multitude of bond pads (28), and for subsequent re-melting of the shaped parts of solder material on the bond pads (28), with arrangement of a template device (21) comprising a multitude of template apertures (27) for accommodating shaped parts of solder material (20) opposite a substrate (23) comprising a bond pad arrangement (29), such that the shaped parts of solder material are associated with the individual bond pads (28); and application of laser energy to the shaped parts of solder material (20) accommodated in the template apertures (27) using a laser device (39) arranged at the rear of the template device (21) such that said laser energy is applied to the shaped parts of solder material through the template device.

21 Claims, 6 Drawing Sheets

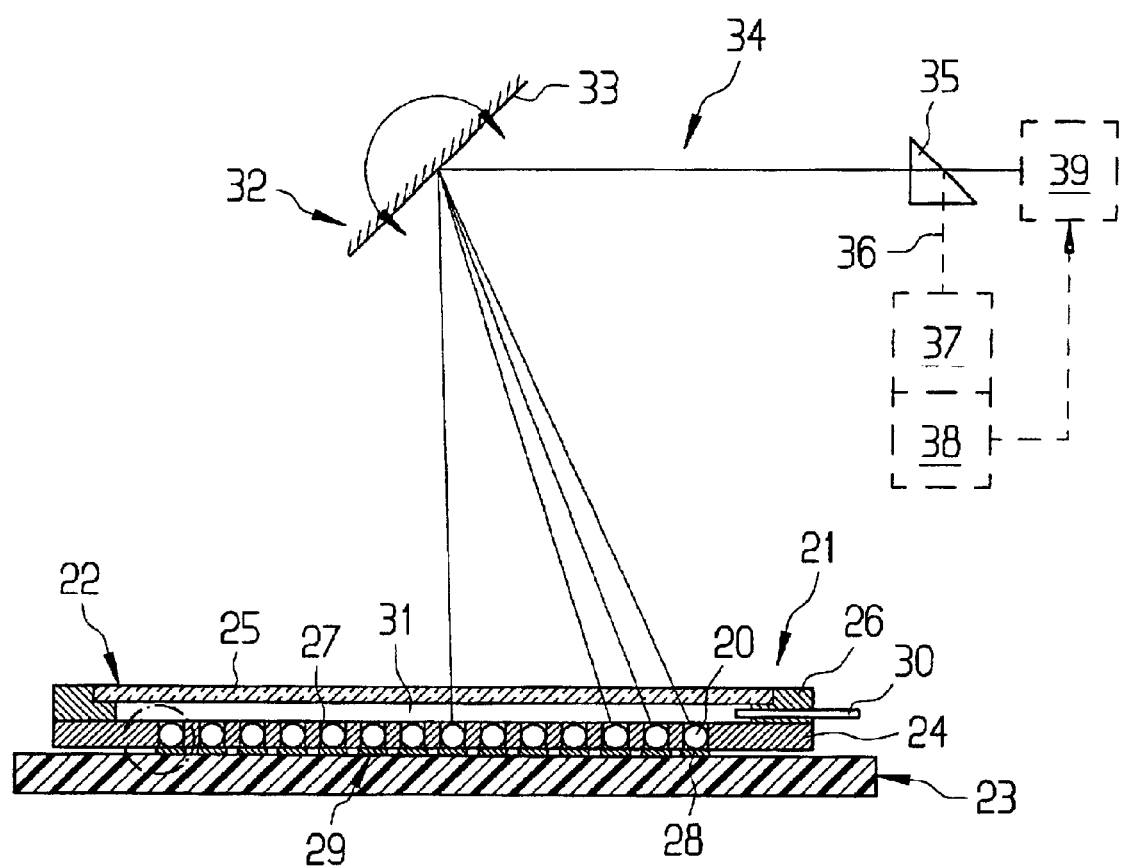

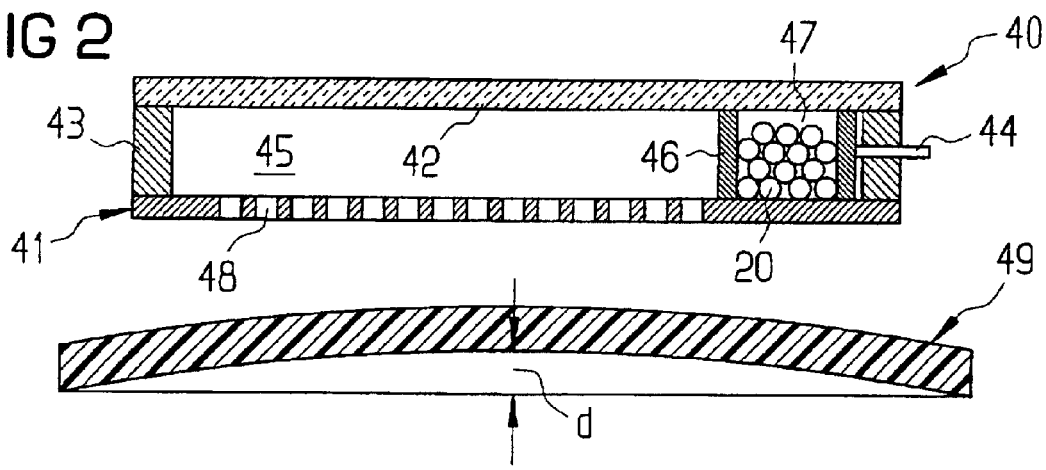
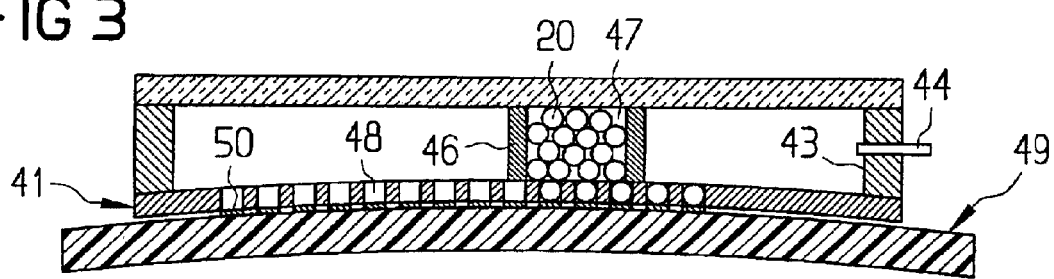
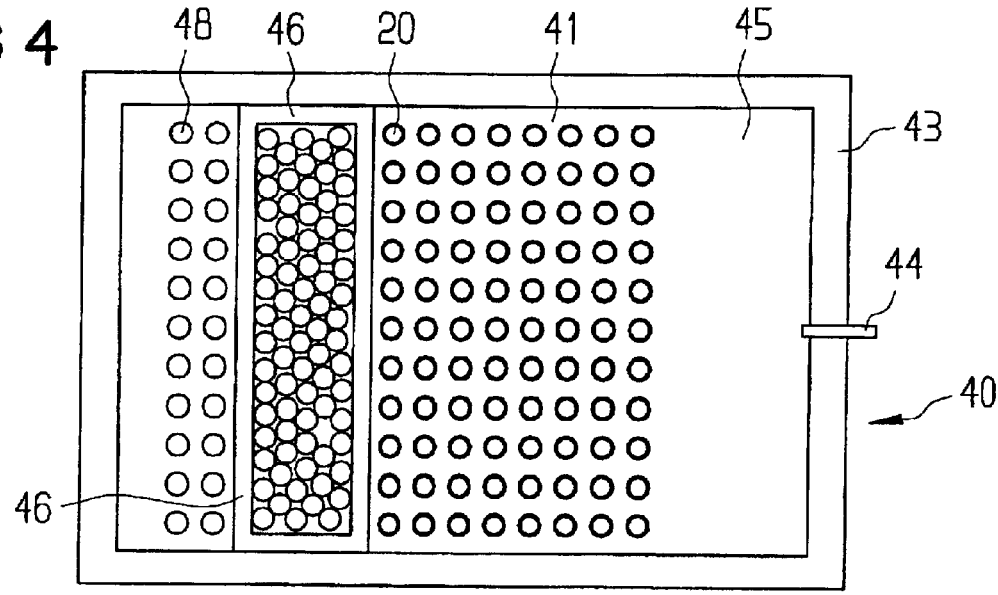

METHOD AND DEVICE FOR PLACING AND REMELTING SHAPED PIECES CONSISTING OF SOLDER MATERIAL

The present invention relates to a method for placing and re-melting a multitude of shaped parts of solder material on a bond pad arrangement of a substrate, said bond pad arrangement comprising a multitude of bond pads, and for subsequent re-melting of the shaped parts of solder material on the bond pads. Furthermore, the present invention relates to a device suitable for implementing this method.

Methods of the type mentioned above are used for example in so-called wafer bumping, in the production of so-called chip-size packages, or in the production of ball grid arrays. Basically, the above-mentioned methods involve the production of a multitude of uniformly shaped bond pad metallisation areas or contact metallisation areas in a specified arrangement, on a substrate surface. To this effect, the following methods have been used up to now. In the first method, placement or arrangement of solder material deposits on the bond pads takes place as part of an individual placement method, and subsequent re-melting takes place by a separate application of heat energy, for example laser energy, to the solder material deposits or to shaped parts of solder material. In the second method, for example in a mask application process, solder material deposits are applied as a paste-like material, and subsequent remelting is carried out in an oven, at the same time for all the solder material deposits.

The first method is particularly advantageous in that as a result of individual application of thermal energy to the solder material deposits or to the shaped parts of solder material, in particular in the case where laser energy is used, the substrate is exposed to as little thermal load as possible. However, this method is also correspondingly slow in its implementation. The second method, in particular due to the rapidly progressing re-melting process, makes it possible to achieve a large throughput with accordingly large numbers being produced. However, the implementation of such a method is associated with considerable production costs, in particular due to the considerable expense of the equipment required. Furthermore, depending on the type of the substrate to be treated in this way, problems will be encountered due to the substantial thermal loads experienced.

It is thus the object of the present invention to propose a method of the type mentioned in the introduction, and to propose a device which is suitable for implementing such a method, which device and method make it possible to place and subsequently re-melt a multitude of shaped parts of solder material on bond pads of a substrate as economically as possible while at the same time keeping thermal exposure of the substrate as low as possible.

This object is achieved by a method with the characteristics of claim 1, and by a device with the characteristics of claim 10 or 15.

In the method according to the invention, first a template device which comprises a multitude of template apertures for accommodating shaped parts of solder materials, is arranged opposite a substrate comprising a bond pad arrangement such that the shaped parts of solder material are associated with the individual bond pads. Then follows application of laser energy, from a laser device which is arranged at the rear of the template device, to the shaped parts of solder material accommodated in the template apertures, such that laser energy is applied through the template device, to the shaped parts of solder material.

Thus the process according to the invention combines a template method which is suitable for carrying out a particularly time-saving placement action, with said method, from the point of view of thermal load, involving a laser re-melting process which is particularly gentle on the substrate.

In a particularly preferred variant of the method, singling-out, which is necessary for applying the individual shaped parts of solder material, takes place in the template device itself, from a quantity of shaped parts of solder material accommodated in the template device, by filling of the template apertures which are arranged in an aperture screen of the template device. In this variant of the method, the template device itself serves as a reservoir for the shaped parts of solder material, thus obviating the need for a separate feed device for feeding shaped parts of solder material to the template device.

In a variant of the method which is also very advantageous, singling out of the shaped parts of solder material by the template device takes place by removing shaped parts of solder material from a quantity of shaped parts of solder material arranged outside the template device, such that during removal, the template device's template apertures, which are arranged in an aperture screen, are filled.

In this variant, the template device itself serves as a removal device, so that there is no need to provide a separate device for supplying shaped parts of solder material to the template device and for removing shaped parts of solder material from said template device.

Irrespective of the choice of the above-mentioned variants, it is advantageous if prior to the application of laser energy to the shaped parts of solder material, scanning of the template apertures using an optical scanning device for detecting shaped parts of solder material, takes place.

This makes it possible to detect any defective spots very early, i.e. prior to any quality assurance test which may take place after the re-melting action. Furthermore, the laser device can be made to be triggered only if a shaped part of solder material is present at the particular bond pad, thus preventing any thermal damage to the substrate due to the bond pad being directly exposed to laser energy.

It has also been shown to be particularly advantageous if application of laser energy to the shaped parts of solder material takes place via the optical scanning device which is already being used for detecting shaped parts of solder material.

If that variant of the method is used where, as explained above, the template device itself serves as a reservoir for the shaped parts of solder material, it is advantageous if filling of the template apertures arranged in an aperture screen of the template device, takes place by means of a filling chamber which can be moved over the aperture screen and which is open towards said aperture screen.

A further advantageous option when realising the variant of the method according to the invention where the template device itself serves as a reservoir for the shaped parts of solder material, consists of filling the template apertures which are arranged in an aperture screen of the template device by means of a paddle-wheel device which can be moved parallel to the surface of the aperture screen, rotating on its movement axis.

When realising the variant described above, of the method according to the invention, where the template device itself serves as a removal device for removing the shaped parts of solder material from a reservoir for shaped parts of solder material, it is advantageous if filling of the template apertures arranged in the aperture screen of the template device, takes place by means of pressure below atmospheric.

Irrespective of the variants, described above, for implementing the process according to the invention, in any case the shaped parts of solder material accommodated in the template apertures can be exposed to pressure so as to generate contact with the bond pads, by means of pressure above atmospheric applied in the template device. It is also possible to generate contact via mechanical pressure of the template device itself.

The device according to the invention, which is particularly suitable for implementing the method according to the invention, provides for a template device comprising a container for accommodating a quantity of shaped parts of solder material, with the container comprising a container wall arrangement, designed as an aperture screen, for conveying shaped parts of solder material to the bond pad arrangement, and with the aperture screen comprising a singling-out device such that shaped parts of solder material which have been singled out from the quantity of shaped parts of solder material and allocated to individual bond pads of the bond pad arrangement, are arranged so as to be exposed, in template apertures of the aperture screen, and thus can be exposed to laser energy by means of a laser device arranged at the rear of the template device.

According to a preferred embodiment, the singling-out device is designed so that it can be moved over the aperture screen. The singling-out device can be a filling chamber which can be moved over the aperture screen, said filling chamber being open towards the aperture screen.

A further advantageous option consists of the singling-out device being designed as a paddle-wheel device which can be moved over the aperture screen, with radially open transport compartments delimited by paddles of a paddle wheel of the paddle-wheel device.

If irrespective of its design, the singling-out device is accommodated in a closed space which is formed by the template device whose rear wall, which is arranged opposite the aperture screen, is made so as to be transparent, it is possible to overlay application of the individual shaped parts of solder material to the bond pads of the bond pad arrangement of the substrate, with pressure above atmospheric. The same also applies to the re-melting process. It is particularly advantageous in this context if a protective gas atmosphere is used to generate the pressure above atmospheric.

In an alternative embodiment of the device according to the invention, the template device itself is a singling-out device, comprising a housing with an aperture screen, said aperture screen comprising a multitude of template apertures for accommodating shaped parts of solder material, and comprising a transparent rear wall, arranged opposite the aperture screen.

If pressure below atmospheric is applied to such a template device, it can itself serve as a singling-out device and/or removal device for removing shaped parts of solder materials from a reservoir containing shaped parts of solder material. In this case, due to removal of the shaped parts of solder material from the reservoir, automatic filling of the template apertures takes place as a result of the application of pressure below atmospheric.

If the diameter of the template apertures formed in the aperture screen is smaller than the smallest diameter of the shaped parts of solder material, it is possible, when pressure below atmospheric is applied, to hold the shaped parts of solder material by partial vacuum to the aperture cross-section of the template apertures so that at the same time as singling-out, exposed arrangement of the shaped parts of solder material results which makes it possible, via the template device, to mechanically press the shaped parts of solder material against the bond pads of the bond pad arrangement.

If the diameter of the template apertures formed in the aperture screen is larger than the largest diameter of the shaped parts of solder material, and if the distance between the aperture screen and the rear wall is smaller than the smallest diameter of the shaped parts of solder material, it is possible to arrange the shaped parts of solder material in the interior of the template device, while maintaining the singled-out arrangement, so as to be able to carry out the subsequent re-melting action to a very large extent within the template device.

It is particularly advantageous if the wall structure of the aperture screen and/or of the sidewalls of the filling chamber, which can be moved over the aperture screen, is flexible across the area of the aperture screen. This makes it possible to achieve an aperture screen which contacts the substrate surface to a very large extent even if said substrate surface is uneven.

To this effect, the wall structure can comprise at least three layers, with a flexible compression layer sandwiched between two wear-resistant surface layers. It is particularly advantageous if the compression layer is made from a plastic material, and the surface layers are made from metal.

Below, preferred variants of the method according to the invention as well as preferred embodiments of the device according to the invention, used to this effect, are explained in more detail with reference to the drawings, as follows:

FIG. 1 is a schematic diagram of a variant of the method according to the invention;

FIG. 2 shows a variant of the method according to the invention using a template device comprising a filling chamber, prior to arrangement on a substrate surface and prior to carrying out the re-melting action;

FIG. 3 shows the template device shown in FIG. 2, after arrangement on the substrate surface;

FIG. 4 is a top view of the template device shown in FIGS. 2 and 3;

Figure 5:
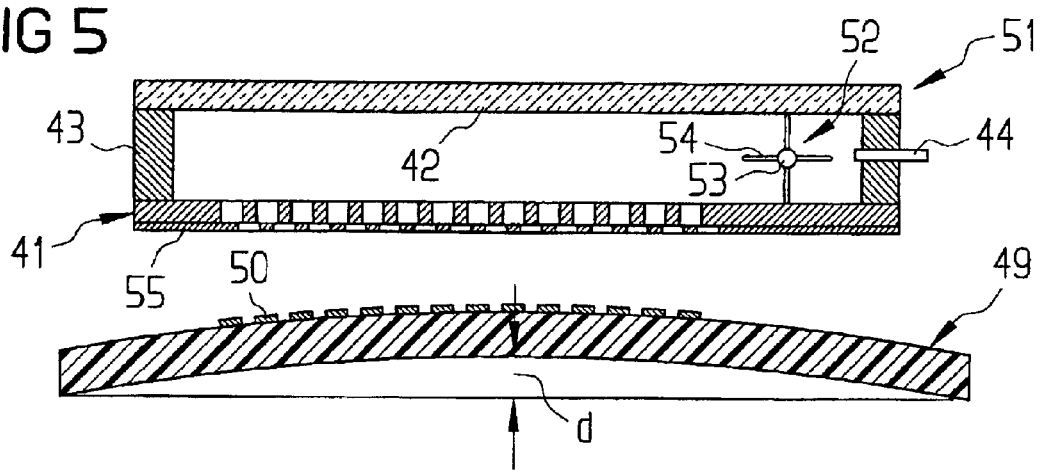
FIG. 5 shows a further variant of the method according to the invention, using a template device comprising a paddle-wheel device, prior to arrangement on a substrate surface and prior to carrying out the re-melting action.

FIG. 1 is a schematic diagram showing one option for implementing a method for placing shaped parts of solder material 20 for a subsequent remelting action. To this effect, a template device 21 is provided which comprises a housing 22 composed of an aperture screen 24 arranged opposite a substrate 23; a transparent rear wall 25 arranged opposite the aperture screen 24; and a sidewall frame 26 connecting the rear wall 25 to the aperture screen 24.

The aperture screen 24 comprises template apertures 27 in which the shaped parts of solder material 20 are arranged such that they establish contact with associated bond pads 28 of a bond pad arrangement 29 of the substrate 23.

As can be seen from FIG. 1, the template device 21 comprises a pressure connection 30 which makes it possible to apply gas pressure to an interior space 31 of the template device 21. In the configuration shown in FIG. 1, a pressure above atmospheric present in the interior space 31 is applied to the shaped parts of solder material 20, thus resulting in contact being formed between the shaped parts of solder material 20 and the associated bond pads 28 of the substrate 23. In this configuration a re-melting action (explained below) can be initiated.

As shown by way of example in FIG. 1, in order to carry out the remelting action, an optical scanning device 32 is arranged above the transparent rear wall 25 of the template device 21; said scanning device comprising a swivelling mirror 33 arranged in a scanning beam path 34. In the present case, a beam deflection device 35, designed as a prism, is arranged in the scanning beam path 34: said beam deflection device making it possible to decouple the detector ray path 36 from the scanning beam path 34. Depending on the rotational position of the swivelling mirror 33, the detector ray path 36 establishes an optical connection between the individual shaped parts of solder material 20 and the associated bond pads 28 of the substrate 23. In the present case, at the end of the detector ray path 36 there is an infrared detector 37 as well as a solder material detector 38 which is for example a CCD camera. At the end of the scanning beam path 34 there is a laser device 39 which, depending on the rotational position of the swivelling mirror 33, makes it possible to apply laser energy to the individual shaped parts of solder material 20.

Although for reasons of clarity this is not shown in FIG. 1, the swivelling mirror 33 not only comprises a swivelling axis extending across the plane of the drawing, but also a swivelling axis along the plane of the drawing, thus making possible area scanning of the template device 21 or the shaped parts of solder material 20 accommodated therein.

To carry out the re-melting action, the two-axis swivelling movement of the swivelling mirror 33 stops, triggered by the solder material detector 38. Activation of the laser device 39 to apply laser energy to the respective shaped parts of solder material 20 detected, takes place, also triggered by the solder material detector 38. During operation of the laser device 39, the infrared detector 37 makes it possible to monitor the temperature, if necessary with respective changes in the settings of the laser device 39 being made.

FIG. 2 shows a template device 40 which, analogous to the template device 21 shown in FIG. 1, comprises an aperture screen 41, a transparent rear wall 42, a sidewall frame 43 and a pressure connection 44. Located in an interior space 45 is a filling chamber 47 which in the present example comprises four sidewalls 46 and which in the present case is delimited at the top and bottom by the rear wall 42 and by the aperture screen 41 respectively. Arranged in the filling chamber 47 is a multitude of shaped parts of solder material 20 which are used to fill template apertures 48 in the aperture screen 41.

Below the template device 40 shown in FIG. 2, there is a substrate 49 which in the present case comprises a surface curvature with a bow d.

As shown in FIG. 3, when the template device 40 is arranged on the surface of the substrate 49, the aperture screen 41 conforms to the surface of the substrate 49. When this conformant state has been reached, the filling chamber 47 is moved in a translatory way over the aperture screen 41. In this process, shaped parts of solder material 20 from the bulk of the shaped parts of solder material 20 arranged in the filling chamber 47, are singled out into the template apertures 48 of the aperture screen 41.

This process is shown in FIG. 4 which is a top view of the template device 40, with the transparent rear wall 42 making it possible to see the interior space 45 of the template device 40.

The top view of FIG. 4 clearly shows that due to the translation movement of the filling chamber 47, filling of the template apertures 48 in the aperture screen 41 occurs. When the aperture screen 41 has been completely filled and when the filling chamber 47 has returned to its home position as shown in FIG. 2, application of laser energy to the individual shaped parts of solder material 20 can take place, as described with reference to FIG. 1. Via the pressure connection 44 provided in the sidewall frame 43, an inert gas atmosphere can be applied to the interior space 45. Apart from a non-oxidising re-melting action, said inert gas atmosphere can also provide the required pressure for pressing the shaped parts of solder material 20 against bond pads 50 of the substrate 49. (FIG. 3).

FIG. 5 shows a template device 51 which in the same way as the template device 40 shown in FIGS. 2 to 4, comprises an aperture screen 41, a rear wall 42, a sidewall frame 43 and a pressure connection 44.

Figure 6:
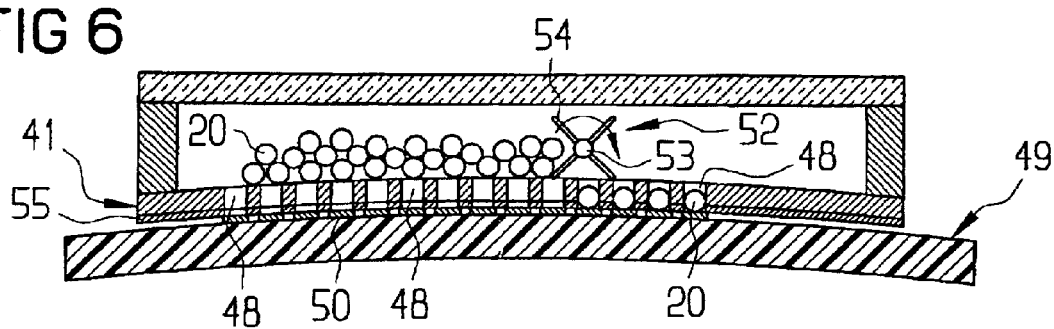
FIG. 6 shows the template device shown in FIG. 5, after arrangement on the substrate surface.
Figure 7:
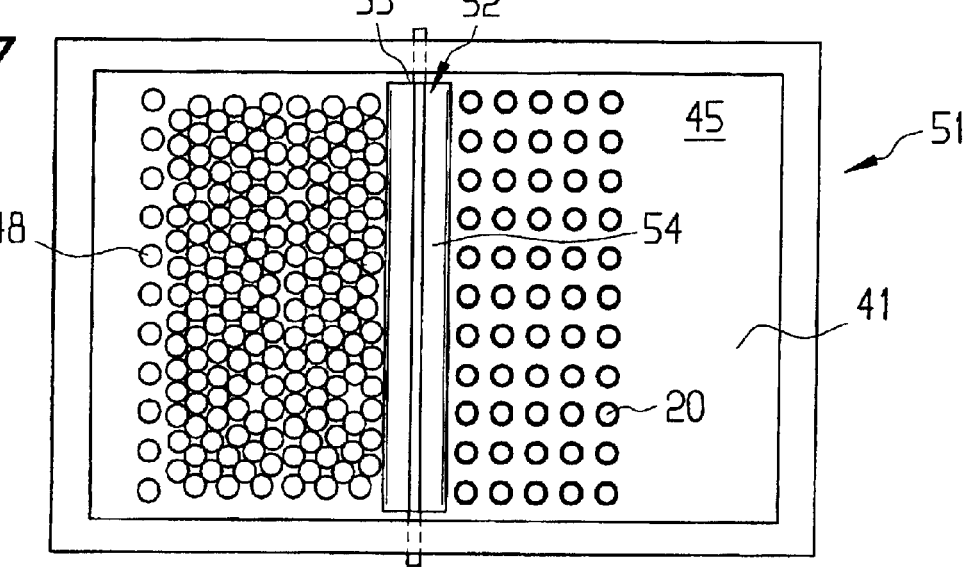
FIG. 7 is a top view of the template device shown in FIGS. 5 and 6.

By contrast to the template device 40 shown in FIGS. 2 to 4, the template device 51 comprises a paddle-wheel device 52 instead of the filling chamber 47 used with template device 40. The paddle-wheel device 52 comprises a paddle wheel 53 with paddles 54 which extend across the width of the interior space 45, as is shown in particular in FIG. 7. As is also shown in FIGS. 6 and 7, for filling the template apertures 48 in the aperture screen 41, the paddle-wheel device 52 is moved along the aperture screen 41 in a translatory way while rotating. In this process, the paddle-wheel device 52 pushes the bulk of shaped parts of solder material 20 ahead, while at the same time the paddles 54, which are preferably made so as to be elastic, displace shaped parts of solder material 20, moving them into the template apertures 48.

To prevent shaped parts of solder material 20 from leaving the template apertures 48 prior to arrangement of the template device 51 on the substrate 49, the aperture screen 41 comprises a closing screen 55 which has an aperture pattern that is identical to that of the aperture screen 41. By a sliding movement relative to the aperture screen 41, the closing screen when moved to its closed position as shown in FIG. 5, closes the template apertures 48. In its open position, shown in FIG. 6, the apertures in the closing screen 55 are arranged and aligned so as to coincide with the template apertures 48.

Figure 8:
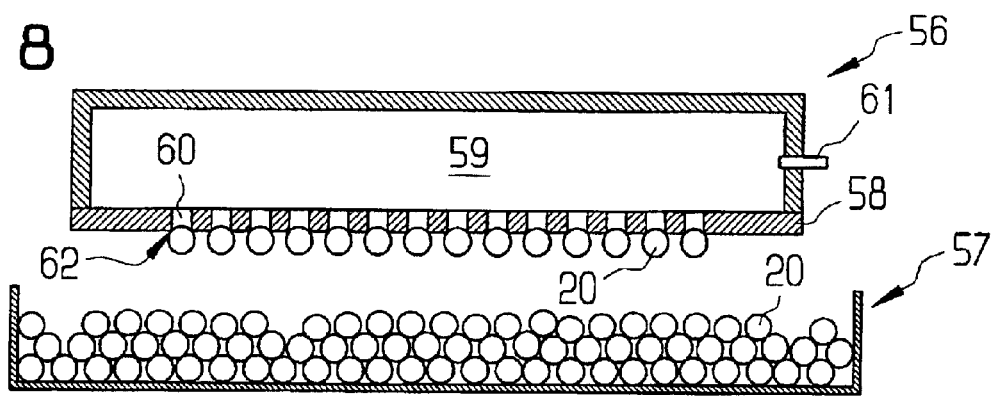
FIG. 8 shows a further embodiment of a template device after accommodating shaped parts of solder material.
Figure 9:
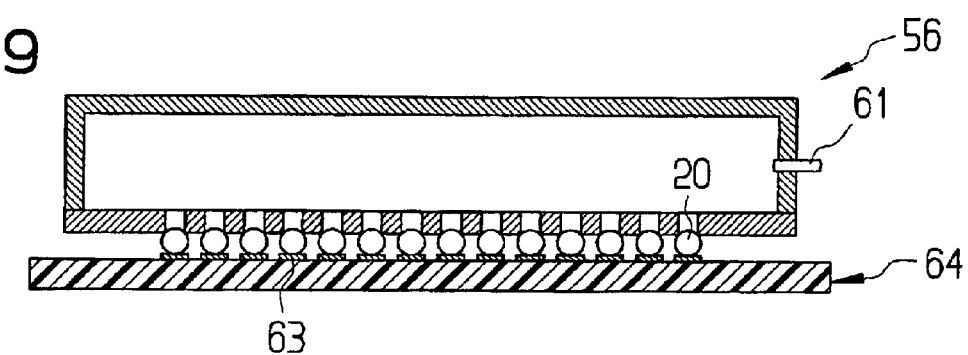
FIG. 9 shows the template device shown in FIG. 8, after accommodating shaped parts of solder material.

FIGS. 8 and 9 show a template device 56 which at the same time serves as a removal device for removing shaped parts of solder material 20 from a reservoir 57. To this effect, the template device 56 with its aperture mask 58 is lowered to the reservoir 57 and through a pressure connection 61, pressure below atmospheric is applied to an interior space 59 of the template device 56. Due to the fact that the diameter of the shaped parts of solder material 20 is larger than that of template apertures 60 in an aperture screen 58 of the template device 56, singled out shaped parts of solder material 20 remain clinging in exposed positions to aperture cross sections 62 of the template apertures 60 when the template device 56 is withdrawn from the reservoir 57.

FIG. 9 shows the arrangement, in preparation of a subsequent re-melting action, of the shaped parts of solder material 20 on bond pads 63 of a substrate 64. As shown in FIG. 9, in this embodiment of the template device 56 the pressure necessary for the shaped parts of solder material 20 to be pressed against the bond pads 63, can also be applied mechanically via pressure exerted onto the template device, or by the inherent weight of the template device 56.

Figure 10:
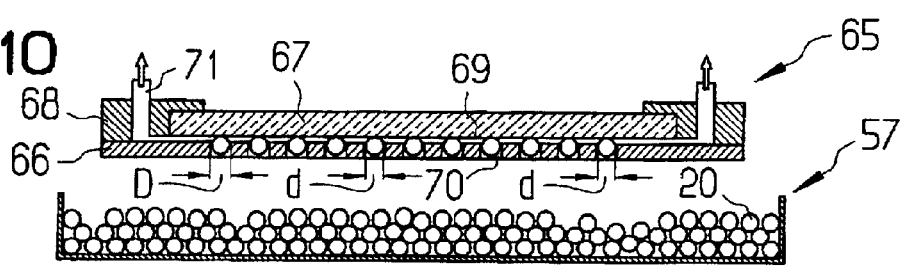
FIG. 10 shows a further embodiment of the template device prior to arrangement on a substrate surface.
Figure 11:
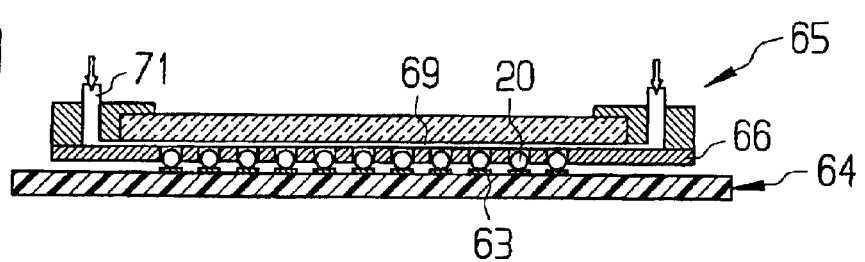
FIG. 11 shows the template device shown in FIG. 10, after arrangement on a substrate surface.

FIGS. 10 and 11 show a template device 65 which like the template device 56 shown in FIGS. 8 and 9, is also suitable for the removal of singled-out shaped parts of solder material 20 from a reservoir 57. FIG. 10 shows the removal position while FIG. 11 shows the application position. As is the case with the template device 56 shown in FIGS. 8 and 9, the template device 65 also comprises an aperture screen 66, a transparent rear wall 67 and a sidewall frame 68. As is also shown in FIG. 10, an interior space 69 or gap is formed by a clearance a between the aperture screen 66 and the rear wall 67, with the clearance a being smaller than the diameter d of the shaped parts of solder material 20. By contrast, the diameter D of template apertures 70 in the aperture screen 66 is larger than the diameter d of the shaped parts of solder material 20. Thus, if pressure below atmospheric is applied to the interior space 69 via pressure connections 71 in the sidewall frame 68, the configuration as shown in FIG. 10 results, in which the shaped parts of solder material 20 are accommodated as they adhere to the template apertures 70.

In the application position shown in FIG. 11, the template device 65 is arranged above the substrate 64 so that there is only little clearance. To establish contact between the shaped parts of solder material 20 and associated bond pads 63 of the substrate 64, pressure above atmospheric is applied to the interior space 69 via the pressure connections 71.

Figure 12:
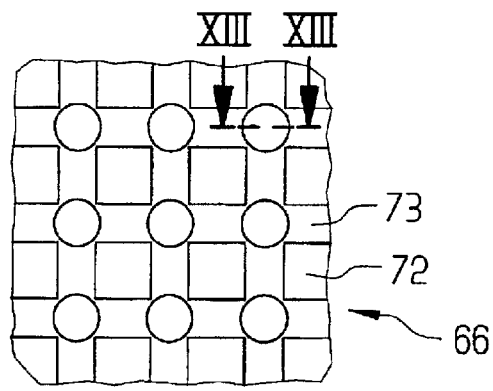
FIG. 12 is a partial view from below, of the template device shown in FIGS. 10 and 11, with the template apertures being shown.
Figure 13:
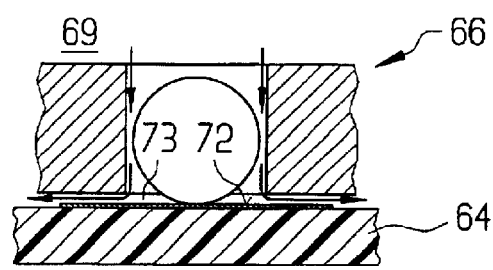
FIG. 13 is an enlarged sectional view of a template aperture along section XIII—XIII shown in FIG. 12.

FIGS. 12 and 13 are partial views from below, of the aperture screen 66 which shows that the aperture screen 66 comprises a contact surface 72 with channels 73 interconnecting the individual template apertures 70. As shown in FIG. 13, the channels 73 make it possible for a gas which is kept at pressure above atmospheric in the interior space 69, to flow out. This makes it possible for the contact surface 72 to contact the substrate 64, for defined arrangement of the template device 65 or the aperture screen 66, without this preventing outflow of the gas kept at a pressure above atmospheric.

Figure 14:
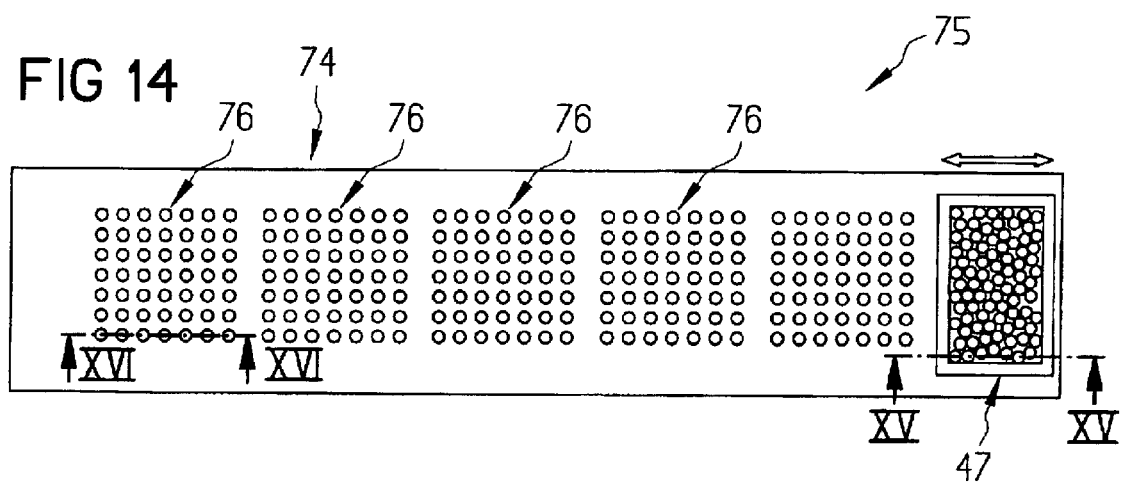
FIG. 14 is a top view of an embodiment of a template device with a multitude of template segments.
Figure 15:
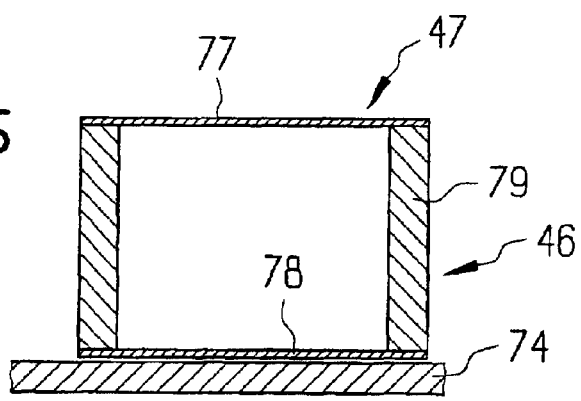
FIG. 15 is a sectional view of the filling chamber shown in FIG. 14.

FIG. 14 is a top view of an aperture screen 74 of a template device 75 which comprises a multitude of template segments 76. The template device 75 comprises a filling chamber 47 whose function and design have already been described. The sectional view of the filling chamber 47 according to FIG. 15 shows that the sidewalls 46 of the filling chamber 47 to across the are of the aperture screen 74 are of a multilayer wall construction. Between two outer surface layers 77 and 78 made of metal so as to be wear resistant, there is a compression layer 79 made of a non rigid plastic material, for example polyamide.

Figure 16:
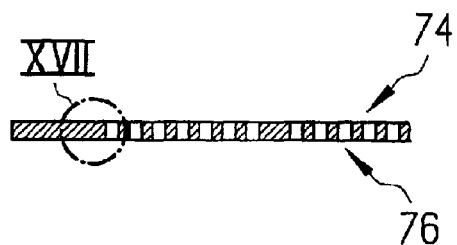
FIG. 16 is a sectional view of the template segment shown in FIG. 14, along section XVI—XVI shown in FIG. 14.
Figure 17:
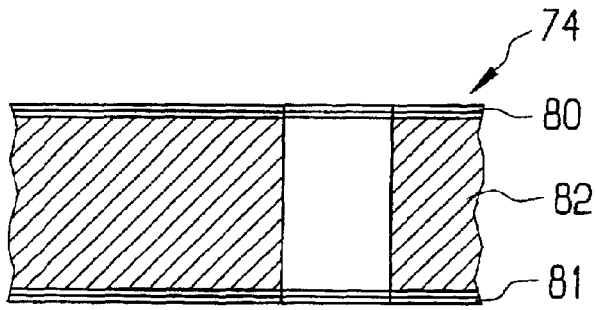
FIG. 17 is an enlarged partial view of the section shown in FIG. 16.

FIG. 16 is a partial section view of the aperture screen 74, while FIG. 17 is an enlarged partial view of this partial section. FIG. 17 shows that the wall design of aperture screen 74 essentially corresponds to that of the sidewalls 46 of the filling chamber 47. A non-rigid compression layer 82 is sandwiched between two outer surface layers 80, 81 which are wear resistant.

The combined effect of sidewall 46 designed in this way, of the filing chamber 47, and of the aperture screen 74, is a deformation ability as for example shown in FIG. 3. The wall design of the aperture screen 41 shown in FIG. 3 is identical to that of the aperture screen 74. FIG. 3 shows that as a result of such wall design, even major surface curvatures or instances of deformation of the substrate can be compensated for. Consequently, any impediments when carrying out the method for placing and re-melting a multitude of shaped parts of solder material on bond pads of a substrate by means of different variants and embodiments, can to a very large extent be prevented.

Figure 18:
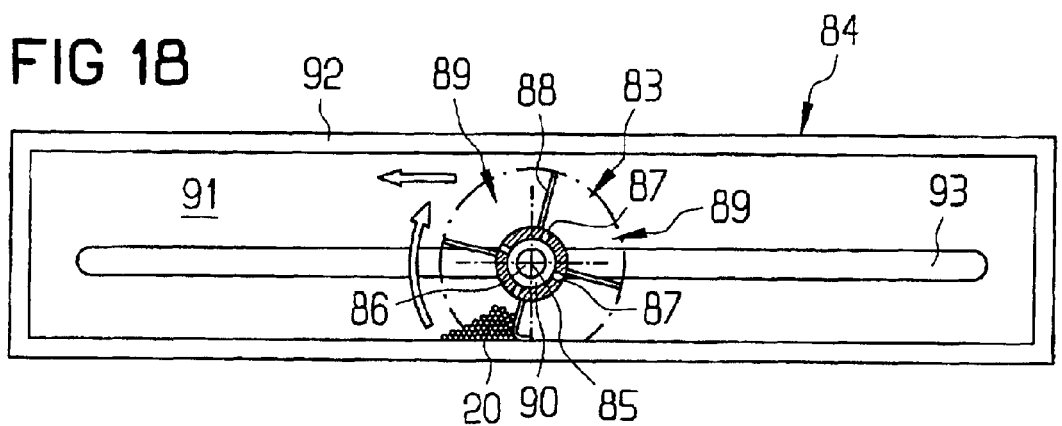
FIG. 18 shows a variant of the paddle-wheel device shown in FIGS. 5, 6 and 7.

FIG. 18 shows a paddle-wheel device 83 as a variant of the paddle-wheel device 52 shown in FIGS. 5, 6 and 7. As is the case with paddle-wheel device 52, the rotational axis 85 of paddle-wheel device 83 is guided in a template device 84 in a translatory way. To this effect, the present embodiment comprises lateral guide slots 93 provided in the template device 84. As indicated by arrows in FIG. 18, the translation of the rotation axis 85 can be accompanied by a counter rotation. As shown in FIG. 18, the rotation axis 85 comprises a gas inlet 86, in the present case in the form of a drill hole, which leads to gas outlet devices 87 extending along the rotation axis 85. The gas outlet devices 87 can for example be longitudinal slots or rows of drill holes. Irrespective of the embodiment, the gas outlet devices 87 lead to transportation chamber compartments 89 delimited by paddles 88 of the paddle-wheel device 83. As is also shown in FIG. 18, these gas outlet devices make it possible for a gas stream 90 to be applied to the shaped parts of solder material 20 arranged in the transportation chamber compartments 89. The gas stream 90 is used to remove any shaped parts of solder material 20 which may cling to the elastic paddles 88. The gas flow 90 is also used to support the effect of the paddle-wheel device 83 which acts in the manner of a doctor blade.

In particular if a gas stream 90 of inert gas is applied to the shaped parts of solder material 20, a transparent cover 92, e.g. a glass pane, covering the interior space 91 of the template device 84, is advantageous. The use of dry gasses has been shown to be advantageous to counteract a tendency of the shaped parts of solder material 20 to cling to the paddles 88. The use of nitrogen by way of a gas stream, too, has also been shown to be advantageous.

What is claimed is:

1. A method for placing a multitude of shaped parts of solder material on a bond pad arrangement of a substrate, said bond arrangement comprising a multitude of bond pads, and for subsequent re-melting of the shaped parts of solder material on the bond pads, method comprising the steps of:

arranging a template device, comprising a multitude of template apertures for accommodating shaped parts of solder material opposite a substrate comprising a bond pad arrangement, such that the shaped parts of solder material are associated with the individual bond pads;

applying laser energy to the shaped parts of solder material accommodated in the template apertures using a swivelling mirror and a laser device arranged at the rear of the template device such that said laser energy is applied to the shaped parts of solder material through the template device;

selecting shaped parts of solder material from a bulk of shaped parts of solder material accommodated in the template device by filling the template apertures arranged in an aperture screen.

2. The method according to one claim 1, further comprising the steps of:
  scanning of the template apertures using an optical scanning device for detecting shaped parts of solder material, prior to the application of laser energy to the shaped parts of solder material.

3. The method according to claim 2, wherein, application of laser energy to the shaped parts of solder material takes place via the optical scanning device.

4. The method according to claim 1, wherein, said step of filling of the template apertures arranged in the aperture screen of the template device takes place using a filling chamber movable over the aperture screen, said filling chamber being open towards the aperture screen.

5. The method according to claim 1, wherein, said step of filling of the template apertures arranged in the aperture screen of the template device takes place using a paddle-wheel device guided substantially in parallel to the surface of the aperture screen, rotating on a movement axis.

6. The method according to claim 1, further comprising the steps of:
  exerting pressure on the shaped parts of solder material accommodated in the template apertures for establishing contact with the bond pads by applying pressure above atmospheric pressure.

7. A method in accordance with claim 1, further comprising:
  swivelling said swivelling mirror to direct laser energy from said laser device to a plurality of said template apertures.

8. A device for placing a multitude of shaped parts of solder material on a bond pad arrangement of a substrate, said bond pad arrangement comprising a multitude of bond pads, and for subsequent re-melting of the shaped parts of solder material on the bond pads, the device comprising:
  a template device with a container for accommodating a quantity of shaped parts of solder material, said container comprising a transparent rear wall and a container wall forming an aperture screen for conveying shape parts of solder material to the bond pad arrangements, the aperture screen comprising a selecting device such that shaped parts of solder material which have been singled out from the quantity of shaped parts of solder material and allocated to individual bond pads of the bond pad arrangement, are arranged so as to be exposed, in template apertures of the aperture screen, and thus can be exposed to laser energy from the side of the template device which is turned away from the substrate by means of a laser device.

9. The dance according to claim 8, wherein, the selecting device is movable over the aperture screen.

10. The device according to claim 9, wherein, the selecting device is a filling chamber which can be moved over the aperture screen, said filling chamber being open towards the aperture screen.

11. The device according to claim 9, wherein, the selecting device is a paddle-wheel device movable over the aperture screen, with radially open transport compartments delimited by paddles of the paddle-wheel device.

12. The device according to claim 8, wherein, the selecting device is accommodated in a space closed by the template device with a rear wall opposite the aperture screen made transparent.

13. The device according to claim 8, wherein, one or both of the wall structure of the aperture screen and the sidewall of the filling chamber, which can be moved over the aperture screen, is flexible across the area of the aperture screen.

14. The device according to claim 13, wherein, the wall structure comprises at least three layers, with a flexible compression layer sandwiched between two wear-resistant surface layers.

15. The device according to claim 14, wherein, the compression layer is made from a plastic material, and the surface layers are made from metal.

16. A device in accordance with claim 8, wherein:
  said transparent rear wall has a transparent portion that exposes a plurality of said template apertures to laser radiation.

17. A device for placing a multitude of shaped parts of solder material on a bond pad arrangement of a substrate, said bond pad arrangement comprising a multitude of bond pads, and for subsequent re-melting of the shaped parts of solder material on the bond pads, the device comprising;
  a template device with a selecting device, said template device including a housing with an aperture screen comprising a multitude of template apertures for accommodating shaped parts of solder material and transparent rear wall, opposite the aperture screen, the diameter of the template apertured formed in the aperture of being larger than the largest diameter of the shaped parts of solder material, and the distance between the aperture screen and the rear wall being smaller than the smallest diameter of the shaped parts of solder material.

18. A device in accordance with claim 17, wherein:
  said transparent rear wall has a transparent portion that exposes a plurality of said template apertures to laser radiation.

19. A method for placing a multitude of shaped parts of solder material on a bond pad arrangement of a substrate, said bond pad arrangement comprising a multitude of bond pads, and for subsequent re-melting of the shaped parts of solder material on the bond pads, method comprising the steps of:
  arranging a template device, comprising a multitude of template apertures for accommodating shaped parts of solder material opposite a substrate comprising a bond pad arrangement, such that the shaped parts of solder material are associated with the individual bond pads;
  applying laser energy to the shaped parts of solder material accommodated in the template apertures using a swivelling mirror and a laser device arranged at the rear of the template device such that said laser energy is applied to the shaped parts of solder material through the template device;
  scanning the template apertures using an optical scanning device for detecting shaped parts of solder material, prior to the application of laser energy to the shaped parts of solder material, application of laser energy to the parts of solder material taking place via the optical scanning device.

20. The method according to claim 19, further comprising the steps of:
  filling the template apertures which are arranged in an aperture screen of the template device to select the shaped parts of solder material from a quantity of shaped parts of solder material outside the temple device.

21. The method according to claim 20, wherein, said step of filling of the template apertures arranged in the aperture screen of the template device, takes place by means of pressure below atmospheric.

* * * * *